(12) United States Patent
Zhang et al.

(10) Patent No.: US 8,772,943 B2
(45) Date of Patent: Jul. 8, 2014

(54) OFFSET OF CONTACT OPENING FOR COPPER PILLARS IN FLIP CHIP PACKAGES

(75) Inventors: Xueren Zhang, Singapore (SG); Kim-Yong Goh, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 12 days.

(21) Appl. No.: 13/313,397

(22) Filed: Dec. 7, 2011

(65) Prior Publication Data

US 2013/0147052 A1    Jun. 13, 2013

(51) Int. Cl.
*H01L 29/72* (2006.01)

(52) U.S. Cl.
USPC .............. 257/774; 257/685; 257/737

(58) Field of Classification Search
USPC .......................... 257/685, 737, 774
See application file for complete search history.

(56) References Cited

U.S. PATENT DOCUMENTS

| | | | |
|---|---|---|---|
| 6,268,662 B1 * | 7/2001 | Test et al. ...................... | 257/784 |
| 2006/0237833 A1 * | 10/2006 | Klein et al. ................... | 257/686 |
| 2013/0026621 A1 * | 1/2013 | Tsai et al. ..................... | 257/737 |

* cited by examiner

*Primary Examiner* — Edward Wojciechowicz
(74) *Attorney, Agent, or Firm* — Seed IP Law Group PLLC

(57) ABSTRACT

An integrated circuit die has a dielectric layer positioned over all the contact pads on the integrated circuit die. Openings are provided in the dielectric layer over each of the contact pads of the integrated circuit die in order to permit electrical coupling to be made between the integrated circuit and circuit boards outside of the die. For those contact pads located in the central region of the die, the opening in the dielectric layer is in a central region of the contact pad. For those contact pads located in a peripheral region of the die, spaced adjacent the perimeter die, the opening in the dielectric layer is offset from the center of the contact pad and is positioned closer to the central region of the die than the center of the contact pad is to the central region of the die.

14 Claims, 7 Drawing Sheets

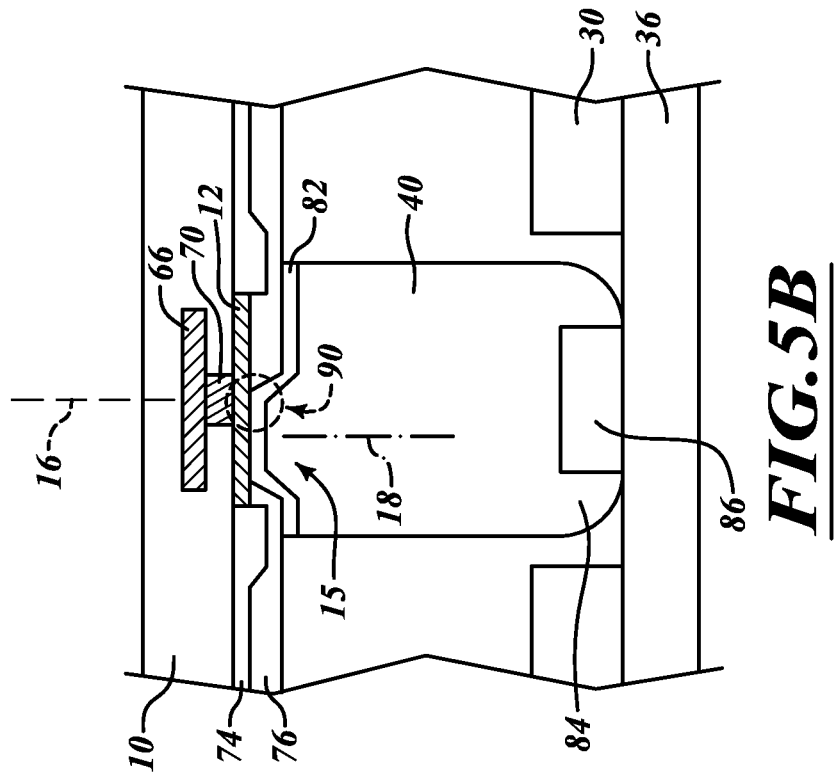
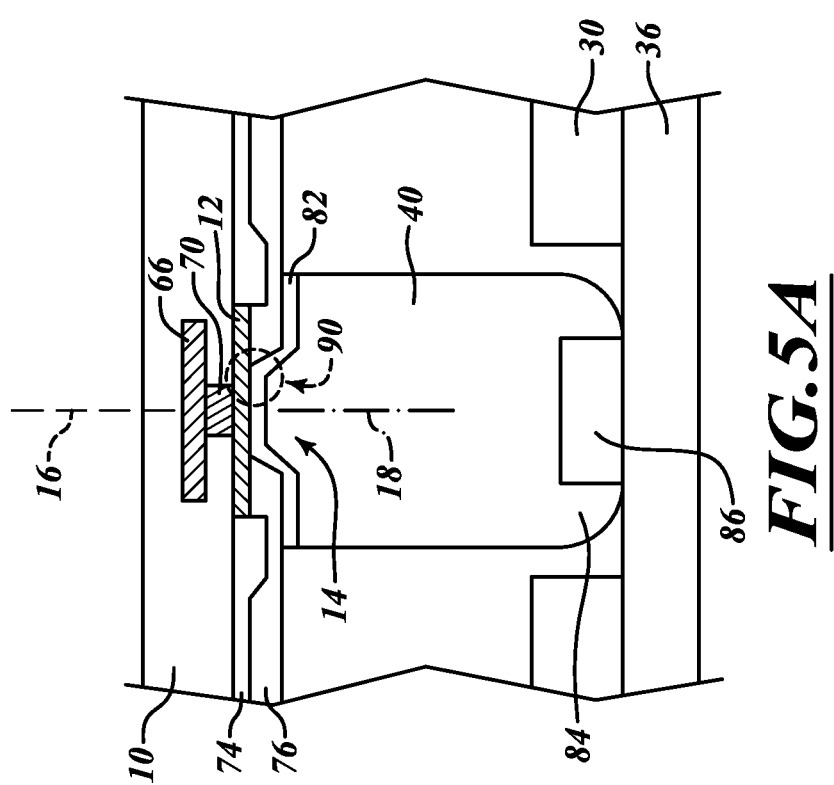

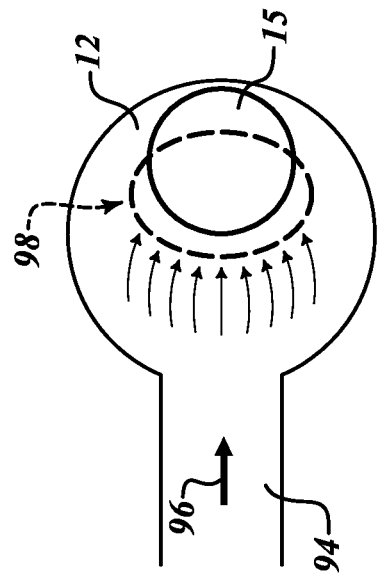
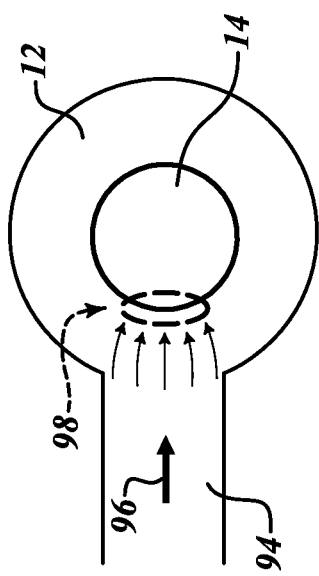
FIG.6B
FIG.6A

OFFSET OF CONTACT OPENING FOR COPPER PILLARS IN FLIP CHIP PACKAGES

BACKGROUND

1. Technical Field

This invention relates to the contact opening for pillar bumps in flip chip packages and, more particularly, to positioning the opening in an offset location to reduce the stress on the underlying integrated circuit.

2. Description of the Related Art

As integrated circuits become more dense, a larger number of contacts are made between the integrated circuit and the outside package based on the increasingly larger number of circuits contained in each integrated circuit chip. In addition to higher transistor packing density and more circuits on an integrated circuit die, the switching speeds are becoming much faster and lower power is being used. One of the reasons switching speed is becoming faster is the reduced capacitance in the intermetal dielectric layers. Currently, many low-k dielectrics are used between the metal layers which significantly reduces the capacitance and increases the speed of operation.

Most low-k dielectrics are constructed of a material which does not have the same mechanical strength as prior dielectrics used in the same locations. For example, many low-k dielectrics are made of nano porous material, aero gels, or other material which have a large number of air pockets therein. Since air has a dielectric constant of one, which is the lowest dielectric material available, the more air pockets which can be placed in the intermetal dielectric, the lower the dielectric constant will become and the faster the chip operation. Unfortunately, placing a large number of air pockets in the intermetal dielectric significantly reduces their physical integrity and strength. Prior to the use of significant low-k dielectrics, the various layers making up the integrated circuit had substantial structural integrity and had a hardness comparable to glass or silicon carbide. However, with the presence of many air pockets and nano pores in the low-k dielectrics, the material can be more easily crushed and, if too much stress is placed on the top surface of the package, the dielectric layers will crack or collapse, thus causing failure of the integrated circuit. It is therefore beneficial to reduce, whenever possible, the amount of stress which is placed on the integrated circuit in order to reduce the likelihood of crushing, cracking, or otherwise damaging one or more of the intermetal dielectric layers of the integrated circuit.

BRIEF SUMMARY

According to the principles as described herein, an integrated circuit die is provided having a plurality of transistors formed in the silicon substrate. Overlying the silicon substrate are a plurality of metal layers which are separated by dielectric material to keep the metal layers electrically isolated. The dielectric material is a low-k dielectric conventionally made using an aero gel, nano porous material, or other material having a large number of air pockets. A top metal layer is positioned for exposure to electrical contact from outside the integrated circuit in order to carry power and data signals to and from the integrated circuit. A large number of the contact pads are positioned across the upper surface of the wafer. Some of the contact pads are positioned in a central region of the integrated circuit die while other contact pads are positioned at a peripheral region of the die, spaced closer to the perimeter than the contact pads at the central region of the die. The dielectric layer overlays all the contact pads on the integrated circuit die. Openings are provided in the dielectric layer over each of the contact pads of the integrated circuit die in order to permit electrical coupling to be made between the integrated circuit and circuit boards outside of the die. For those contact pads located in the central region of the die, the opening in the dielectric layer is in a central region of the contact pad. For those contact pads located in a peripheral region of the die, spaced closer to the perimeter, the opening in the dielectric layer is offset from the center of the contact pad and is positioned closer to the central region of the die than the center of the second contact pad is to the central region of the die.

The particular arrangement of having the center of the contact opening offset from the center of the contact pad in the peripheral regions of the integrated circuit significantly reduces the stress that is applied on the integrated circuit layers directly below the contact pad. By placing the opening in the dielectric layer offset from the center of the contact pad, the stress on the contact pad is significantly reduced. The reduction in stress on the contact pad reduces the likelihood that the dielectric layers will be crushed, cracked, or otherwise damaged during packaging or later when the die is used. This increases the yield of good packaged die and also increases the reliability of integrated circuit over its lifetime.

Copper pillars are positioned in the opening of the dielectric layer to provided physical and electrical contact to the integrated circuit die.

A further benefit is that the electrical flow from the contact pad to the copper pillar has a larger surface area over which it can enter the copper pillar to flow between the copper pillar and the contact pad, thus, reducing the potential for creating voids in the electrical connection due to electromigration. When the opening in the dielectric layer is offset, more space is provided at the interface between the aluminum pad to the copper pillar. Thus, electrical crowding is alleviated.

The offsetting of the contact opening is easily achieved by controlling the locations of the openings in the mask that forms the openings through the dielectric layer to the contact pads. Accordingly, for low cost and without the use of additional masks the stress on the integrated circuit die is reduced, the reliability of the package is increased, and the potential for problems due to electromigration over the life of the die are substantially reduced.

BRIEF DESCRIPTION OF THE SEVERAL VIEWS OF THE DRAWINGS

FIGS. 5A and 5B are enlargements of the region marked 5 in FIG. 3 illustrating the prior art and the present invention, respectively.

FIGS. 6A and 6B are top views of an electrical contact pad illustrating benefits of the present invention.

DETAILED DESCRIPTION

Figure 1:
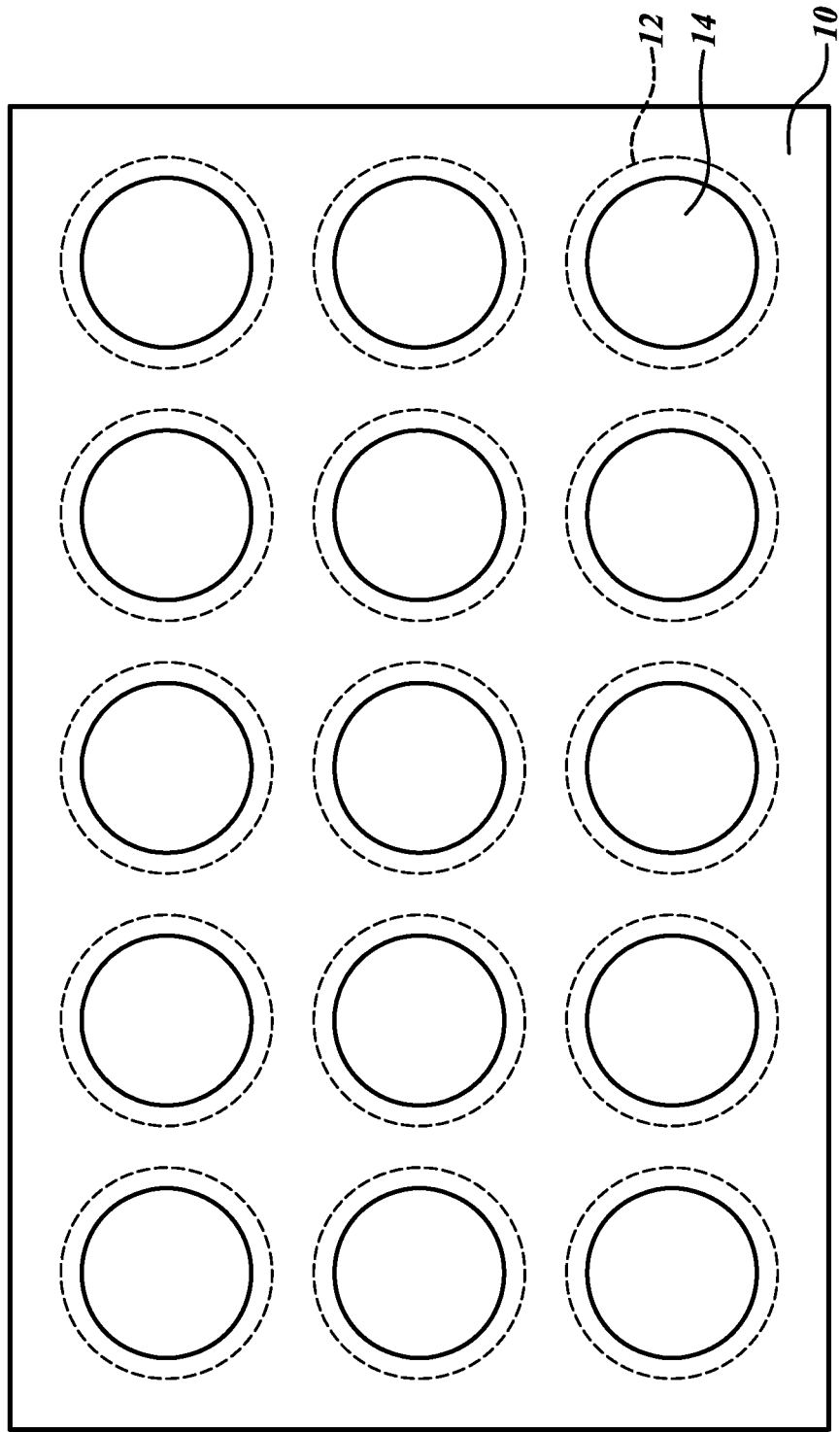
FIG. 1 is a top side view of an integrated circuit die according to the prior art.

FIG. 1 illustrates a top view of an integrated circuit die 10 having contact pads 12 and openings 14 through an upper dielectric layer according to the prior art. In the prior art, it is common to have the contact opening 14 positioned in the center of the contact pad 12. This was done to increase the repeatability to make a proper alignment between the contact pad 12 and an electrical conductor to be placed in the contact opening 14. The electrical conductor to be placed in the contact opening 14 can be any type of acceptable electrical conductor such as a copper pillar, a solder balls, solder paste, or any of the many available known electrical conductors for use with contact pads of integrated circuits.

In addition, traditionally it is preferred to make the contact opening 14 as large a practical in order to increase the surface area of contact between the electrical conductor and the contact pad 12. The electrical trace to the contact pad 12 is not shown in FIG. 1, but one example is shown in FIG. 6A.

While the contact pads 12 are shown as circles, in most integrated circuits the contact pads 12 are formed as squares or rectangles. Alternatively, they can be any other desired shape such as ellipse, a polygon, whether square, rectangle, octagon, or the like. Usually, simple geometric shapes are used for the contact pads 12, the preferred ones in the prior art being simple squares, rectangles, and circles.

Figure 2:
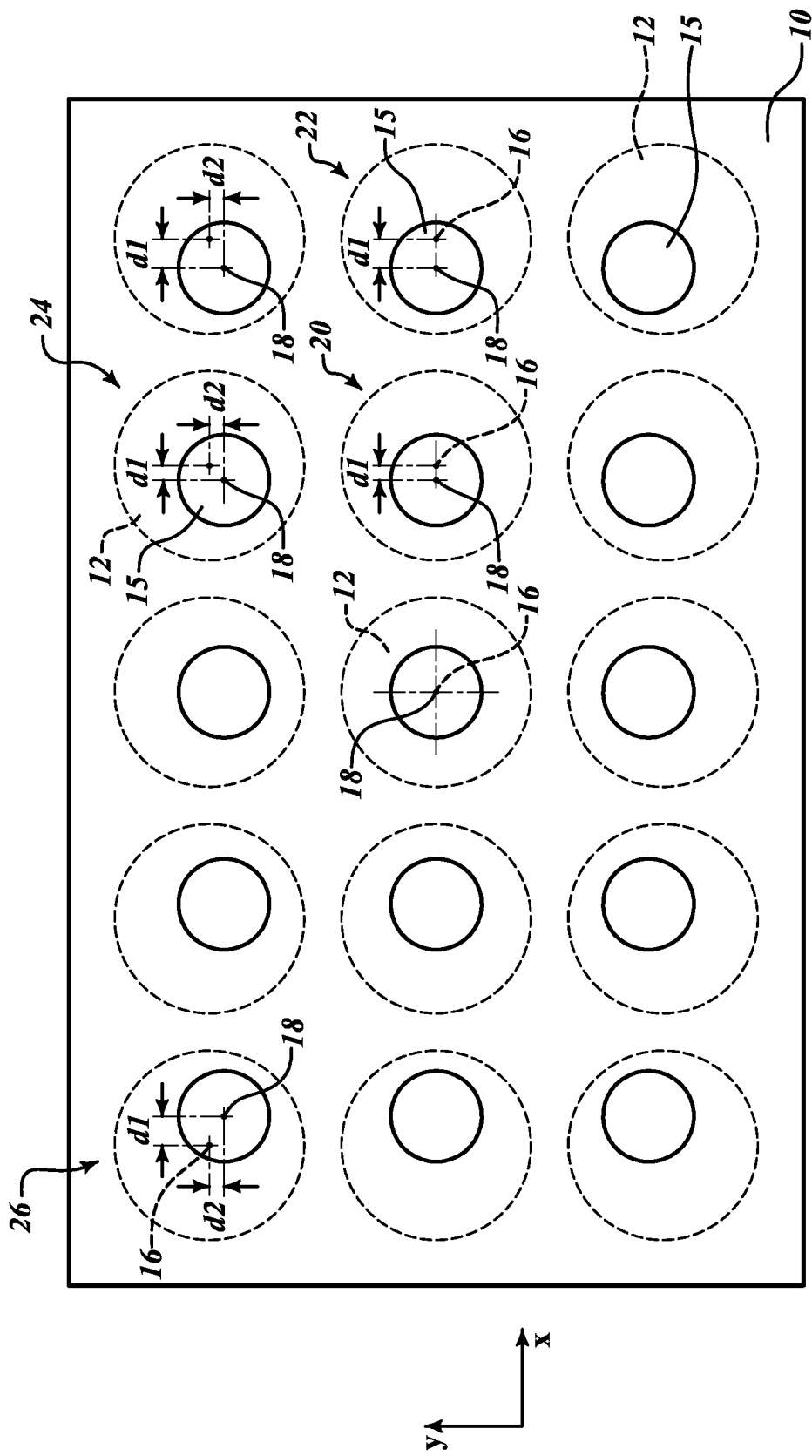
FIG. 2 is a top side view of an integrated circuit die based on principles of the present invention as described herein.

FIG. 2 shows the contact opening 15 having different features and properties than the contact opening 14 of the prior art.

As is immediately apparent, in one embodiment, the contact opening 15 is significantly smaller than the contact opening of the prior art. As will be explained later herein, the larger contact opening places more force and stress on the low-k dielectric layers below the contact. The use of a smaller contact opening 15 reduces the total amount of the force and pressure which is applied to the low-k dielectric layers in the integrated circuit chip and, thus, reduces the likelihood of damage to these low-k layers. Therefore, a smaller dielectric opening is preferred for low-k dielectric materials to reduce the stress on the die with the use of the proper dielectric material. However, the contact opening cannot be reduced in an unlimited amount due to the electrical current flow requirements. As can be appreciated, as the contact opening 15 is made smaller, the current density through the contact is increased and, if it is made too small the overall resistance of the contact may be noticeably increased sufficient to alter the operational characteristics of the integrated circuit. Accordingly, the contact opening 15 should not be made so small as to increase the resistance of the contact to the contact pad or cause electrical reliability problems. Accordingly, a reduction in size of approximately 20% from current contact openings is acceptable in order to maintain good electrical conductivity and high reliability while at the same time reducing the amount of stress placed on the low-k dielectric materials below the contact pad 12. Thus, while in the prior art it was common for the contact opening and the electrical contact to take up approximately 90% of the area of the exposed contact pad 12, according to one embodiment of the present invention, the contact opening 15 takes up approximately 50% or less of the area of the contact pad 12. In one embodiment, the contact opening is between 40% and 50% of the total area of the underlying contact pad.

The size of the contact opening 15 may also be customized according to the type of contact being made and the expected current densities the contact will carry, in one embodiment. For example, if the contact opening is for a power supply, such as VDD, ground, or other high current flow use, then the contact opening is made significantly larger, in the range of 50% to 70% at the contact pad area, in order to provide low resistance and high reliability for those connections having a very large current flow. On the other hand for those connections which have a very small current flow, such as data signals, address signals, or other very low current, high speed uses, the contact 15 can be made 20% or 30% smaller than the power connections, covering less than 50% of the area of the contact pad 12 and still provide low resistance and good electrical conductivity with respect to the signals carried thereon. Thus, it is acceptable to have contact openings 15 of different sizes on the same integrated circuit die depending on the use of the contact whether for power, ground, address pins, data pins, signaling pins, or other pins having low current densities or which switch infrequently with low currents.

FIG. 2 illustrates another feature according to one embodiment of the present invention. As can be seen in FIG. 2, fifteen contact pads 12 are illustrated positioned equally spaced from each other and in a regular pattern on the top of the integrated circuit die 10. The contact pads 12 have a center of the contact pad denoted with reference number 16. The reference number 18 denotes the center of the contact opening 15. Viewing the very center contact pad 12 of FIG. 2, it can be seen that the center 16 of the contact pad 12 has the center 18 of the contact opening aligned with it. Accordingly, in a central region of the die the contact opening 15 has its center aligned approximately with, and many instances exactly on, the center 16 of the contact 12. Contact pads that are spaced from the central region of the die have the center 18 of the contact opening 15 offset from the center 16 of the contact pad 12, examples of which are shown in FIG. 2.

Viewing a first example 20 of the contact pad 12 spaced one to the right of the central region, it can be seen that the center 18 of the contact opening 15 is offset by distance d1 in the x direction from the center 16 of the contact pad 12. The amount of the distance d1 of the offset is based on the distance of the particular contact pad 12 from the central region of the die, according to one embodiment. Namely, the further that a particular contact pad 12 is from the central region of the die, the larger the spacing d1 that the center 18 of the contact opening 15 is offset from the center 16 of the contact pad 12. A second contact pad 22 illustrates the increase in the offset distance d1 based on the contact pad 12 being further from the central region of the die. As can be seen viewing contact 22, the center 18 of the contact opening 15 is offset a distance d1 which is greater than the distance d1 for the contact pad 20 which is closer to the central region of the die.

In one embodiment, the amount of the offset d1 of the respective centers of the contact pad 12 and the contact opening 15 is proportional to the distance that the contact pad 12 is from the center region of the die. Namely, the greater the distance from the central region of the die, the greater the offset distance d1 of the centers of the contact pad and the contact opening. In an alternative embodiment, all the contact openings have the same amount of offset in absolute distance d1 with the direction of the offset being based on the position of the contact pad 12 relative to the central region of the die. The direction of the offset is toward the central region of the die, namely, center 18 of the contact opening 15 is placed closer to the central region die than the center 16 of the contact pad 12 is to the center of the die. The distance d1 for the contact pad 20 may be in the range of 2-3 μm. For the contact pad 22, the distance may be in the range of 5 to 6 μm. For contact pads 12 further from the central region, the offset distance will be in the range of 9 to 10 μm.

FIG. 2 also illustrates various examples of contact pads 24 and 26 which are spaced in both an x direction and a y direction away from the central region of the die. Viewing contact pad 24, it can be seen that a y offset d2 is also provided in which the center 18 of the contact opening 15 is offset from the center 16 of the contact pad 12. The distance d2 is based on the distance that the contact pad 12 is from the central region of the die in the y direction. Another example is found in contact pad 26 which is located near a peripheral region of the die 10. In the instance of contact pad 26, the distance d1 is greater than d2 because it is spaced a greater lateral distance, in the x direction from the central region of the die than it is in the y direction. While a distance d2 in the y direction that the center 18 of the contact opening 15 is offset from the center 16 of the contact pad 12, this distance d2 is not as great as the distance d1 because the contact pad 26 is further in the x direction from the center region of the die than it is in the y direction.

The distance d2 for the contact pad 24 may be in the range of 2-3 μm. For the contact pad 26, the distance may be in the range of 5 to 6 μm. For contact pads 12 further from the central region, the offset distance will be in the range of 9 to 10 μm.

In one alternative embodiment, the offset current is the same for all contact openings which have an offset. In this embodiment, a first group of pads 12 in the central regions have no offset. A second group of pads further from the central region in the x direction have a common offset toward the center, for example, 5 μm for all pads. A second group of pads 12 are located on the other side of the central region in the negative x direction having a common offset of 5 μm as well, but in the opposite direction, namely, toward the center region of the die. Similarly, the pads 12 located at positions spaced from the center region in the y direction have a common offset amount, for example, 5 μm in the y direction, in each instance toward the center region of the die 10. Some pads 12 located in positions that are offset in both the x and y directions may have offsets in both directions, for example, 5 μm in the x direction and 5 μm in the y direction, for a total of about 7 μm.

Figure 3:
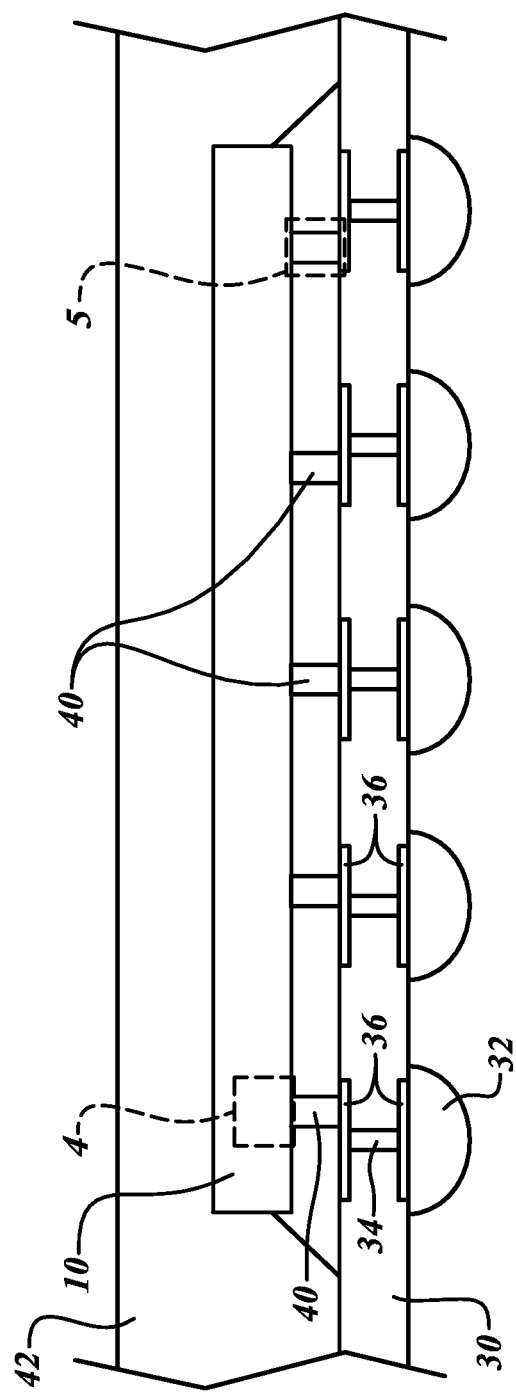
FIG. 3 is a side elevation view of a packaged integrated circuit illustrating different features of the invention.

FIG. 3 is a side view of a final packaged integrated circuit 10 coupled to a printed circuit board 30. The printed circuit board 30 (PCB) includes a number of solder bumps 32 for electrically connecting the integrated circuit to other circuits or other printed circuit boards. A number of plated through-holes 34 and electrical lead lines 36 provide electrical connection from the solder bumps 32 to the side of the PCB 30 facing the integrated circuit die 10. Copper pillars 40 electrically connect the integrated circuit die 10 to the various traces 36 on the PCB 30. The copper pillars 40 are connected to the contact openings 15 of the integrated circuit die to the contact pads 12 shown in FIG. 2. The entire assembly is encapsulated in a package 42. FIG. 3 shows a section 4 which is illustrated in the following FIG. 4 and a section 5 which is enlarged and illustrated in FIGS. 5A and 5B, as will now be explained.

Figure 4:
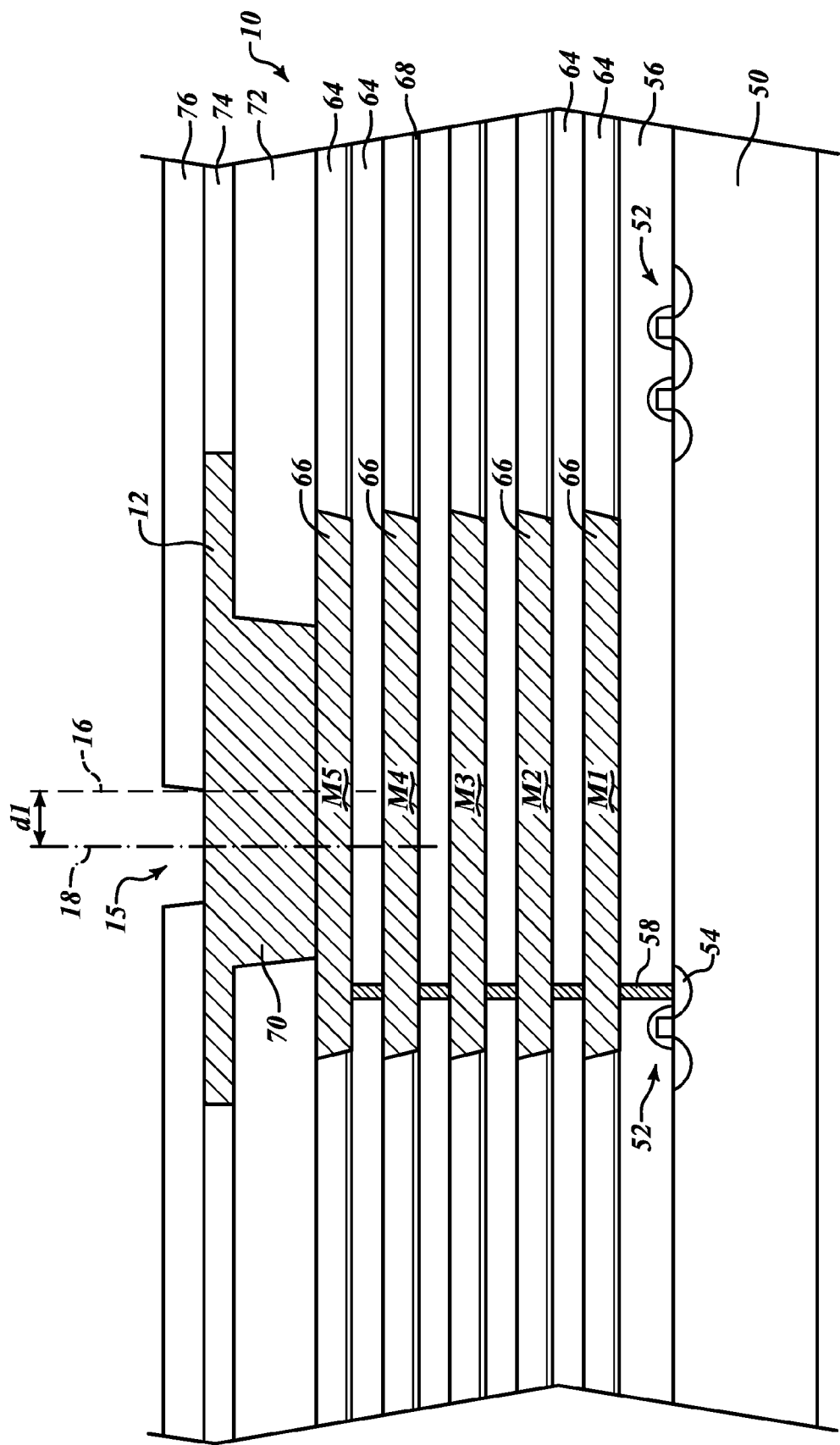
FIG. 4 is an enlarged region of the box marked 4 on FIG. 3.

FIG. 4 illustrates an integrated circuit die 10 having a silicon substrate 50 with a plurality of transistors 52 thereon. As is known, the transistors 52 include source and drain regions 54 which are electrically connected to various metal layers in order to construct circuits on the integrated circuit die 10. As will be appreciated, FIG. 4 is shown inverted from the orientation of FIG. 3, namely, FIG. 4 is shown with a substrate 50 at the bottom and the contact pad 12 at the top of the die. This is a more conventional way for showing the integrated circuit die 10 and is placed in this orientation for ease of understanding, although it is upside down from the orientation of the die 10 shown in FIG. 3.

Turning back to FIG. 4, it can be seen that above the transistors 52 is a first premetal dielectric stack of layers 56. This premetal dielectric layers are usually composed of a plurality of sublayers such as a pure oxide, a BPSG layer, various silicon nitride and other layers in order to provide sidewall spacers for the transistors 52 and electrically insulate them from each other and overlying polysilicon layers and metal layers. Although only one polysilicon layer is shown, there may be two or more polysilicon layers in the premetal dielectric layer 56, providing appropriate electrical interconnections to the various transistors 52. A plug 58, usually a tungsten plug, extends from a source/drain region 54 to the first metal layer 66 labeled M1 on FIG. 4. Adjacent M1 is a first low-k dielectric layer 64. Occasionally, the premetal dielectric layers 56 may also include a low-k dielectric material as well, though generally, the low-k dielectric materials begin above the first metal layer 66 and extend adjacent to and in-between all metal layers above M1. As illustrated herein, a low-k dielectric 64 extends above the first metal layer 66 in order to electrically isolate the first metal layer from the second metal layer 66. Additional metal layers 66 are also positioned above the first metal layer 66 with the appropriate low-k intermetal dielectrics 64 positioned therebetween. While FIG. 4 shows five metal layers, the number may vary greatly depending on the integrated circuit 10 and its intended use. Some integrated circuit dies 10 have as few as one or two metal layers while some have as many as nine or ten. In the example shown, five interconnect metal layers 66 are shown, each having a low-k dielectric 64 therebetween in order to illustrate the main features of the invention.

As is known in the art, the low-k dielectric 64 may be constructed of a plurality of sublayers or of alternating layers of different materials. For example, it is common in the art that the low-k dielectric layer 64 may include a first layer of an aero gel or nano porous material made primarily of a silicon dioxide. Overlying this silicon dioxide layer may be a layer having different proportions of silicon, oxygen, carbon, and in many instances nitrogen, contained therein. Thus, a thin layer of some type of silicon carbide illustrated as layer 68 herein is frequently interspersed between the various low-k dielectrics and aero gels. It is also common to have the low-k dielectric constructed of a number of different materials. For example, a material known in the art as black diamond is frequently used, as is a material called SiLK. Black diamond is a carbon doped silicon dioxide that is a low-k dielectric available from Applied Materials, SiLK is a spin-on organic polymeric dielectric available from Dow Chemical, the initials SiLK standing form Spin-on Low-K material. A number of other materials may be used as low-k dielectrics, including a fluorine-doped silicon dioxide, various combinations of nitrogen or carbon doped silicon dioxide, as well as others which may be developed in the future.

These low-k dielectric layers 64 have a beneficial property of substantially reducing the capacitance between metal interconnect layers 66, thus increasing the speed of operation and lowering the overall impedance of the integrated circuit. Unfortunately, they have significantly less mechanical strength than a very dense silicon nitride, a spin-on glass, a TEOS layer, and other layers which were more commonly used in the prior art. With the use of multiple low-k dielectric layers 64, the integrated circuit die 10 is substantially more fragile, and a small amount of force is sufficient to damage it, such as by crushing, cracking, or otherwise dislodging the low-k dielectric layer 64. Any damage done to one or more of the low-k dielectric layers substantially impacts the reliability of the integrated circuit 10 since this increases the likelihood that one or more of the metal interconnect layers 66 may have electrical contact with one or more of the other metal layers 66 from which it is supposed to be electrically isolated.

The example of the various metal layers in FIG. 4 stacked exactly vertically on top of each other and all electrically interconnected is for ease of illustration, and those of skill in the art know that generally the layers M2 and M3 are not directly on top of each other are only connected at selected locations, with some parts of M2 being electrically isolated from other parts of M2. The stack of vertical layers M1-M5 which directly align on top of each other and all electrically connect to each other is uncommon in an integrated circuit 10. Rather, the more common layout is for the various metal layers 66 to be electrically isolated from each other at most locations even though they pass over one another. For example, normally each of the layers run perpendicular to the layer directly below it such that if the first metal layer 66 runs in the y direction, that the subsequent metal layer M2 will run in the x direction, while the next metal layer M3 will run again in the y direction. Accordingly, there are numerous places in which the various layers 66 crisscross over the top of each other in which they must remain electrically isolated from each other.

At the top of the final metal interconnect layer 66 is a large metal plate 70 on top of which the contact pad 12 is located. (The contact pad 12 may also be constructed from the top metal layer, in this example M5, without the use of the large interconnect 70, and the invention is equally applicable when the top metal interconnect layer 66 also forms the contact pad 12.)

In the embodiment shown in FIG. 4, a passivation layer 72 is above metal 5 to electrically isolate the rest of the chip from the individual contact pads 12. Overlying the passivation layer 72 is a final passivation layer 74, usually made of a hard high density material such as silicon nitride, silicon carbide, or other high density sealing layer. Above sealing layer 74 and the contact pad 12 is the uppermost dielectric layer 76, usually made of a polyimide. While dielectric layer 76 may be made of different types of dielectric materials, the traditional dielectric used for the uppermost layer is polyimide, known as PI in the industry for flip-chip packages.

The use of PI as the uppermost dielectric layer in a flip-chip design has a number of advantages within the context of the present invention. One advantage is that it provides a mechanical buffer layer between the contact pad 12 and other materials outside of die 10. PI material has some shock-absorbing properties, and can be slightly compressed and spread the force of the compression throughout its lateral structure, thus absorbing some of the shock which might otherwise be transmitted to the contact pad 12. The use of PI as the uppermost layer 76 therefore has advantages within the context of the present invention, as explained elsewhere herein.

An opening 15 is etched in the uppermost dielectric layer 76 to provide an electrical contact to the contact pad 12. As can be seen in FIG. 4, the location of the contact opening 15 is offset from a central region of the contact pad 12, as explained herein and shown in more detail in FIG. 5B. In FIG. 4, the amount of offset d1 is 5 microns, center to center, but other distances are also acceptable.

FIGS. 5A and 5B illustrate the advantages of use of the present invention with a polyimide layer as the uppermost dielectric layer and copper pillars as the electrical conductor in contact with the contact pad 12, as will now be explained.

Turning now to FIG. 5A, the integrated circuit die 10 is shown having an upper metal layer 66 which in this example is metal 5, a connection plug 70 and a contact pad 12. As will be appreciated, the examples in FIGS. 5A and 5B show the integrated circuit die 10 in the same orientation as shown in FIG. 3, and therefore is turned over from that shown in FIG. 4. Common reference numbers are used for the same structures in FIGS. 3, 4, 5A, and 5B for ease of reference.

As shown in FIG. 5A, a contact opening 14 is positioned at a central region of the contact pad 12. A dielectric layer 76 in the form of a polyimide has the contact opening 14 patterned and etched to expose the contact pad 12 to receive the copper pillar 40. Frequently, a barrier layer, such as a tantalum alloy 82, gold, layers of nickel, palladium and gold or some other material or layers, is deposited in direct physical contact with the contact pad 12 to provide improved electrical interaction with aluminum, after which the copper pillar 40 is positioned thereon. (Direct physical contact between Al and Cu can sometimes lead to reliability and electrical connection problems over time.) The copper pillar 40 makes electrical contact with the interconnect layer 36 of the PCB 30. The PCB 30 may have one or more interconnect structures, such as a solder ball 84 having an embedded contact metal 86 such as copper or gold, as an interface layer, or it may be a solely solder layer 84. Highlighted in FIG. 5A is a location with circle 90 at which the copper pillar 40 physically contacts the contact pad 12. At this location, significant mechanical stress is placed on the die, which is transmitted through the contact pad 12 to the various low-k dielectric layers 64 located underneath it, as previously illustrated with respect to FIG. 4. The low-k dielectric is very sensitive to mechanical stress, including the stress applied when the copper pillar 40 is first attached as an electrical contact, and in addition, throughout the life of the product, during movement or in use, and undergoes a thermal expansion which is different from a thermal expansion of the contact pad 12, normally made of aluminum, and the copper pillar 40. Differences in the coefficient of thermal expansion between the copper pillar 40, semiconductor die 10, and the contact pad 12 also add to additional stress at the corner regions 90 where the copper pillar 40 physically contacts the contact pad 12. The area 90 is therefore a critical stress region and in some instances the mechanical stress caused by the copper pillar has resulted in delamination of the low-k dielectric or damage to one or more layers of the low-k dielectric, such as by cracking, crushing, or peeling, which reduce the integrity of the integrated circuit 10 and in some cases make the circuit nonoperational. In one instance, the stress measured at the corner region 90 in the conventional design has been measured in the range of 900 Mpa, which in many cases is sufficient to cause damage to the low-k dielectric structures of the integrated circuit 10. As can be seen in FIG. 5A, the center line 16 of the contact pad 12 is exactly aligned with the center line 18 of the contact opening 14.

FIG. 5B illustrates an offset contact opening 15 according to principles of the present invention. FIG. 5B shows the center line 16 of the contact pad 12, and that the center line 18 of the contact opening 15 is laterally offset therefrom. In this instance, the stress at corner 90 is reduced in the range of 12%-15% as compared to a centered contact opening 14 as shown in FIG. 5A. For example, in various tests for an offset of 5 microns, a stress reduction of 12% has been measured. There may be various reasons for the offsetting providing the reduced stress reduction. A first reason is the PI layer 76 is able to more effectively act as a shock absorbing layer to buffer some of the mechanical interaction between the copper pillar 40 and the contact pad 12. The buffer capability of layer 76 means it is able to absorb and spread laterally throughout its structure some of the mechanical pressure from the copper pillar 40 and thus assist to reduce the stress of the corner region 90 due to the offset. In addition, the opening 15 is made smaller than the opening 14 in order to reduce the overall force and pressure that is applied from the copper pillar 40 to the contact pad 12. This reduction in pressure is also assisted by the shock absorbing layer 76. When the copper pillar 40 is pressed into the contact opening 15, some amount of the pressure and the force is absorbed by the layer 76. As the contact opening 15 is made smaller, the amount of area interaction between the copper pillar 40 and the PI layer 76 is increased so that more of the force is absorbed by layer 76 and less of the total force is applied to the contact pad 12.

Whilte applying the same overall force to a smaller area would in many cases increase the force per unit of area, like a small heel of a high heel shoe making a hole in carpet or the tip of a rod used for breaking glass, in this instance the coupling force of the copper pillar 40 is shared by PI layer 76 and contact pad 12. As more of the surface area of the pillar 40 is carried by PI layer 26 and less is carried by pad 12, the force applied to the pad 12 and layers below it decreases. The effect is not always linear because PI layer 76 has significant shock absorbing and mechanical dampening capabilities, thus becoming an even more effective release of the force applied to layer 12 as more area of the pillar is carried by the PI layer 26.

In the embodiment shown in FIG. 5B, the central region of the die is to the left of the copper pillar 40 as shown. Namely, the opening 15 is offset to be more towards the central region of the die 10 and further from the peripheral region, and in this example the central region is to the left-hand side, and thus corresponds to a pad in position 20 or 22 as shown in FIG. 2.

As previously stated, the offset can be one constant value for all contact pads 12 on the die, though in each instance the direction of the offset is to place the contact opening 15 closer to the central region of the die than it is to the perimeter of the die. Alternatively, it may be proportionally related to the distance from the neutral point of the package. The offset is towards the neutral center of the package in order to take advantage of the reduced mechanical stress as explained with respect to FIG. 5B.

Turning now to FIGS. 6A and 6B, a further advantage which may be obtained in some embodiments of the present invention will now be explained. FIG. 6A shows a contact pad 12 having a contact opening 14 at a central region thereof. A conductive trace lead line 94, sometimes referred to as an interconnection line, is electrically coupled to the contact pad 12 so that current may run to and from the contact pad 12 via the copper pillar 40 coupled to the contact opening 14. As shown in FIG. 6A, if the contact opening 14 is at a central region of the contact pad 12, electric current which enters the contact 12 on the lead 94 will experience electrical crowding, as the current 96 runs from the lead 94 to the contact pad 12 and then couples to the copper pillar 40 through the contact opening 14. The location 98 at which the electric current 96 interacts with the contact opening 14 and thus the pillar 40 is at a reduced diameter region for the contact pad 12, and with a reduced area. Some electric crowding occurs in the copper pillar 40 or the solder bump near the site of the dielectric opening adjacent the electrical line 94. This may lead to voiding or other problems due to electrical migration.

FIG. 6B shows the benefits which may be obtained based on the offset of the dielectric opening 15 according to principles of the present invention in one embodiment. In FIG. 6B, an electrical line 94 provides a path by which electrical current 96 can flow via the contact pad 12 through the contact opening 15 to the copper pillar 40. Because the contact opening 15 is offset from the central region, the position at which the current interacts with the copper pillar is at an enlarged diameter region of the contact pad 12. Preferably, the interface location between the copper pillar 40 and the contact pad 12 will occur at the largest diameter portion of the copper pad 12 to provide an enlarged surface area 98 at which the electrical current may flow to the copper pillar 40 via the contact opening 15. With the contact opening 15 offset, more space is given for the electrical flow from the aluminum copper pad 12 to the copper pillar 40, or to a solder bump or other electrical connection extending through the contact opening 15. Thus, electrical crowding would be alleviated and significant benefits are obtained in the form of lower resistivity, fewer electrical migration problems and better reliability through the life of the package.

Figure 7:
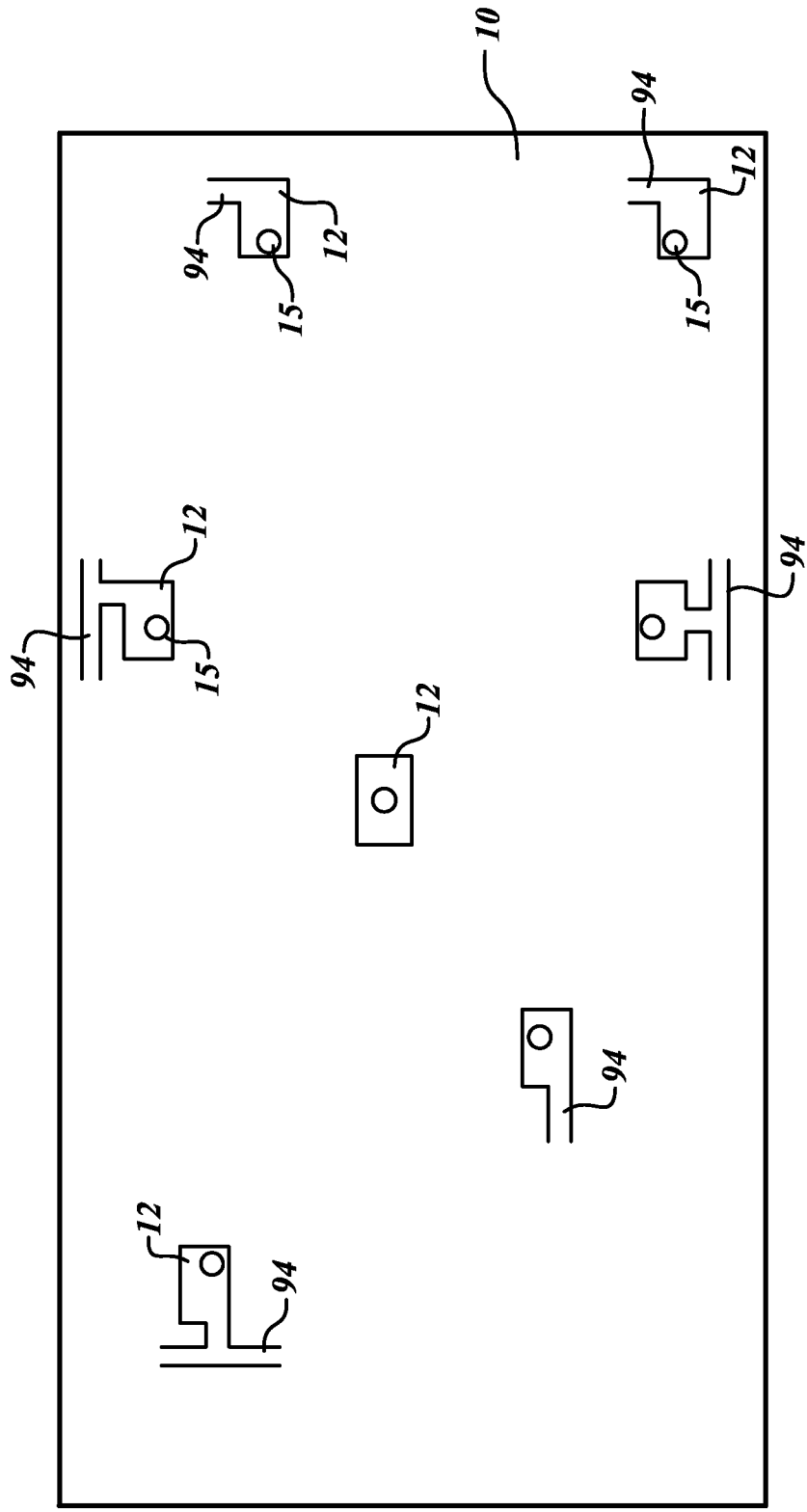
FIG. 7 is a top view of an integrated circuit die having a plurality of contacts thereon according to principles of the present invention.

FIG. 7 illustrates a top surface of the die 10 with the plurality of contact pads 12 thereon similar to that which may be used in a practical application. In the example shown in FIG. 7, the contact pads 12 are square or rectangular, depending on the location and shaping of the pad. Each of the pads 12 is coupled to the integrated circuit by the appropriate conduction lines 94 so that electrical current may run to and from the contact pad 12. The center contact pad 12 does not show a conduction line 12 because it is extending vertically upward from a central region of the die rather than a horizontal extending contact line 94.

As illustrated in FIG. 7, the contact opening 15 is offset from a central region of the contact pad 12. The actual opening of the contact 15 is shown in solid dark lines as a circle, and the center region of the contact pad 12 has a dashed circle thereon.

As can be seen viewing FIG. 7, the center of each contact opening is spaced closer to the center of the die than it would be spaced if it were at the center of the contact pad 12. This offset of spacing from the center of the contact pad 12 provides a number of advantages as has been described. For example, reduced mechanical stress between the copper pillar and the contact pad 12 is achieved. Further, less force and mechanical pressure is applied to the low-k dielectric layers in the die 10 than would be applied if the copper pillar 40 were centrally located in the contact pad, as has been shown and explained. In addition, as can be appreciated, the contact openings 15 are smaller than would normally be used in the prior art. Generally, it is practiced that the contact opening is made as large as the pad 12 will permit, and in many instances extends approximately to each of the four sides of the contact pad 12 so as to have a very large contact surface area and overlay a substantial portion of the contact pad 12. On the other hand, in the embodiment shown in FIG. 7, the contact opening 15 is smaller than would normally be used, yet not so small as to have significant increased resistivity that would affect performance or have reliability problems. As can also be seen in FIG. 7, the contact opening 15 is away from the interconnect line 94 to the contact pad 12, thus reducing electrical crowding of any current that may flow to and from the contact opening 15 and the contact pad 12. Preferably, the location at which the interconnect line 94 enters the contact pad 12 will be selected so as to reduce electrical crowding and be at a location that will provide an enlarged area due to the offset of the contact opening 15 at which the current may enter the copper pillar 40 from the contact pad 12.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
    an integrated circuit die having an upper face with a central region, a peripheral region spaced from the central region and a perimeter around the outmost edge of the upper face of the die;
    a plurality of contact pads positioned on the integrated circuit die;
    a first contact pad of the plurality being located in a central region of said die;
    a second contact pad of the plurality being located in a peripheral region of the die, spaced closer to the perimeter than, and away from, the first contact pad;
    a dielectric layer overlying the contact pads on the integrated circuit die;
    a first opening in the dielectric layer overlying the first contact pad to provide electrical coupling to the first contact pad, the first opening having its center positioned in a central region of the pad; and
    a second opening in the dielectric layer overlying the second contact pad to provide electrical coupling to the second contact pad, the center of the second opening being offset from a center of the second contact pad and having its center positioned closer to the central region of the die than the center of the contact pad is to the central region of the die.

2. The device of claim 1 wherein the dielectric layer is comprised of polyimide.

3. The device of claim 1 wherein the dielectric layer is applied to the die after the die has been singulated from a silicon wafer that includes a plurality of identical dies positioned closely adjacent to each other.

4. The device of claim 1 further including a second dielectric layer overlying the die and being in approximately the same plane as the first contact pad, the second dielectric layer composed of a silicon material.

5. The device of claim 1 further including a copper pillar physically coupled to the contact pad through the second opening.

6. The device of claim 1, wherein an amount of offset between the center of the second opening overlying the second contact pad and the center of the second contact pad is based on the distance of the second contact pad from the central region of the die.

7. The device of claim 6 wherein the amount of the offset is approximately proportional to the distance the second contact pad is from the central region of the die.

8. The device of claim 1 wherein the contact pad is the top metal layer of the integrated circuit die formed while the die is an integral part of a silicon wafer.

9. The device of claim 8 further including:
    a silicon substrate;
    a plurality of electrically conductive metal layers overlying the silicon substrate;
    a plurality of electrically insulating layers positioned between the metal layers to electrically isolate them from each other, the electrically insulating layers being composed of a low-K dielectric having a dielectric constant lower than 2.8 and being a nano porous material.

10. An electrical circuit comprising:
    an integrated circuit die having an upper face;
    a plurality of contact pads positioned on the upper face of the integrated circuit die;
    an electrical interconnection line coupled at a selected location to a first contact pad of the plurality of contact pads;
    a dielectric layer overlying the contact pads on the integrated circuit die;
    an opening in the dielectric layer exposing the first contact pad, the opening having a leading edge that is a closest part of the opening to the selected location at which the interconnection line is coupled to the first contact pad, the leading edge being positioned at a location near a central region of the first contact pad and spaced from the selected location at which the electrical interconnection line is coupled to the first contact pad; and
    an electrically conductive material positioned in the opening and electrically connected to the first contact pad, a center axis of the conductive material being offset from a center location of the opening.

11. The electrical circuit according to claim 10 wherein the electrically conductive material is a copper pillar.

12. The electrical circuit according to claim 11 wherein the contact pad is primarily aluminum.

13. The electrical circuit according to claim 12 further including:
    an interface layer between the contact pad and the copper pillar, the interface layer being a material other than aluminum and copper.

14. The electrical circuit according to claim 10 wherein the dielectric layer is polyimide.

* * * * *